United States Patent
Danelon et al.

(10) Patent No.: US 8,626,105 B2
(45) Date of Patent: Jan. 7, 2014

(54) MIXER-AMPLIFIER FOR AN RF RECEIVE CHAIN

(75) Inventors: Valérie Danelon, Grenoble (FR); Patrice Garcia, Crolles (FR)

(73) Assignee: STMicroelectronics S.A., Montrouge (FR)

(*) Notice: Subject to any disclaimer, the term of this patent is extended or adjusted under 35 U.S.C. 154(b) by 494 days.

(21) Appl. No.: 12/561,153

(22) Filed: Sep. 16, 2009

(65) Prior Publication Data
US 2010/0069031 A1 Mar. 18, 2010

(30) Foreign Application Priority Data

Sep. 18, 2008 (FR) .................................... 08/56298

(51) Int. Cl.
*H04B 1/26* (2006.01)
*H04B 15/00* (2006.01)
*H04B 1/28* (2006.01)

(52) U.S. Cl.
USPC ........... 455/313; 455/293; 455/318; 455/323; 455/333

(58) Field of Classification Search
USPC .................................. 455/293, 313–326, 333
See application file for complete search history.

(56) References Cited

U.S. PATENT DOCUMENTS

| | | | | |
|---|---|---|---|---|
| 7,356,317 | B2 * | 4/2008 | Xu et al. | 455/130 |
| 7,391,257 | B1 * | 6/2008 | Denison et al. | 330/9 |
| 2004/0113679 | A1 * | 6/2004 | vanZeijl | 327/359 |
| 2004/0176064 | A1 * | 9/2004 | Mattisson | 455/313 |
| 2005/0272398 | A1 * | 12/2005 | Chang et al. | 455/326 |
| 2006/0001472 | A1 * | 1/2006 | Krug et al. | 327/359 |
| 2006/0079194 | A1 * | 4/2006 | Tired et al. | 455/283 |
| 2006/0208791 | A1 | 9/2006 | Vilhonen | |
| 2007/0077907 | A1 * | 4/2007 | Rector | 455/323 |
| 2007/0155351 | A1 * | 7/2007 | Oba et al. | 455/188.2 |
| 2008/0032646 | A1 * | 2/2008 | Huang et al. | 455/131 |
| 2008/0042726 | A1 * | 2/2008 | Belot et al. | 327/356 |
| 2008/0057901 | A1 * | 3/2008 | Stoll et al. | 455/323 |
| 2008/0227424 | A1 * | 9/2008 | Muhammad et al. | 455/341 |
| 2009/0323864 | A1 * | 12/2009 | Tired | 375/319 |

FOREIGN PATENT DOCUMENTS

WO  WO 2007057324 A1  5/2007

OTHER PUBLICATIONS

French Search Report dated May 18, 2009, from corresponding French Patent Application No. 08/56298.

* cited by examiner

*Primary Examiner* — Simon Nguyen
(74) *Attorney, Agent, or Firm* — Wolf, Greenfield & Sacks, P.C.

(57) ABSTRACT

A mixer-amplifier of an RF signal including at least an amplifier circuit and a mixing circuit controlled at a local oscillator frequency, for amplifying a signal applied on at least one input terminal and converting a first frequency of this signal into a second, lower, frequency, and including a reverse feedback loop switched at the local oscillator frequency.

5 Claims, 2 Drawing Sheets

MIXER-AMPLIFIER FOR AN RF RECEIVE CHAIN

CROSS REFERENCE TO RELATED APPLICATIONS

This application claims the priority benefit of French patent application number 08/56298, filed on Sep. 18, 2008, entitled MIXER-AMPLIFIER FOR AN RF RECEIVE CHAIN," which is hereby incorporated by reference to the maximum extent allowable by law.

BACKGROUND OF THE INVENTION

1. Field of the Invention

The present invention generally relates to RF receive chains and, more specifically, to chains provided with a so-called low-noise amplifier (LNA) associated with a mixer to convert an RF signal at a relatively high frequency into a signal at a relatively low intermediary frequency with respect to the frequency of the received signal, to recover the envelope of the RF modulation.

The present invention more specifically applies to mobile telephony receive chains.

2. Discussion of the Related Art

FIG. 1 is a block diagram of a conventional example of an RF chain. AN RF signal received by an antenna 1 is processed by a low-noise amplifier 2 (LNA), then by a mixer 3 receiving an intermediary frequency and switching at a so-called local oscillator frequency OL. The output of mixer 3 is intended to be processed by receive circuits 4 (Rx). Most often, filters 5 and 6 respectively at the frequency of the received signal and at the intermediary frequency are provided upstream and downstream of the series-association of amplifier 2 and of mixer 3. Further, other circuits may be interposed between antenna 1 and filter 5. These circuits have been symbolized by an interruption 8 in the path of the signal and may comprise path separators, couplers, impedance matching circuits, etc.

To improve the stability and the frequency matching, as well as the linearity of the reception chain, a reverse feedback 21 is generally performed on low-noise amplifier 2 by feeding back on its input a portion of its output signal. This reverse feedback loop 21 may comprise a filter 22 at the frequency of the RF signal. Such a reverse feedback enables doing away with the use of inductive elements used in impedance-matching circuits, but adversely affects the gain as well as the signal-to-noise ratio of the chain.

Document WO-A-2007/057324 describes an example of an RF reception system in which a signal sampled from the output of a mixer is applied to a low-noise amplifier. This amounts to permanently applying a reverse feedback signal.

Document US-A-2006/0208791 describes another example of an RF receiver using a switched-capacitor filter.

SUMMARY OF THE INVENTION

It would be desirable to have an RF receive chain which takes advantage of a reverse feedback on the low-noise amplifier without adversely affecting the signal-to-noise ratio.

It would also be desirable to decrease the gain losses introduced by the reverse feedback.

To achieve all or part of these objects as well as others, at least one embodiment of the present invention provides a mixer-amplifier of an RF signal comprising at least an amplifier circuit and a mixing circuit controlled at a local oscillator frequency, for amplifying a signal applied on at least one input terminal and converting a first frequency of this signal into a second, lower, frequency, and comprising a reverse feedback loop switched at the local oscillator frequency.

According to an embodiment of the present invention, the reverse feedback loop loop comprises, in addition to a switch, a filter at the local oscillator frequency.

According to an embodiment of the present invention, the amplifier amplifies the signal at the first frequency and is followed by the mixer.

According to an embodiment of the present invention, the mixer is arranged upstream of the amplifier that amplifies the signal at the second frequency.

According to an embodiment of the present invention, the mixer-amplifier is capable of processing differential signals.

According to an embodiment of the present invention, the mixer-amplifier is capable of processing non-differential signals.

At least one embodiment of the present invention also provides an RF receive chain for circuits for interpreting this signal, comprising at least one mixer-amplifier.

At least one embodiment of the present invention also provides an RF reception system.

The foregoing objects, features, and advantages of the present invention will be discussed in detail in the following non-limiting description of specific embodiments in connection with the accompanying drawings.

DETAILED DESCRIPTION

Figure 1:
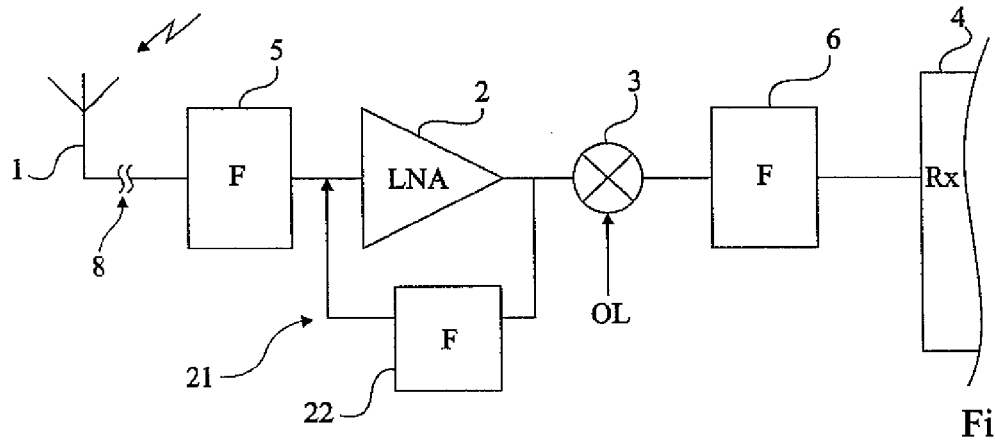
FIG. 1, previously described, shows a common RF receive chain.

The same elements have been designated with the same reference numerals in the different drawings.

For clarity, only those elements which are useful to the understanding of the present invention have been shown and will be described. In particular, the structure of a low-noise amplifier has not been detailed, the present invention being compatible with common designs of such amplifiers. Further, the circuits upstream and downstream of the described mixer-amplifier have not been detailed either, the present invention being here again compatible with usual circuits.

Figure 2:
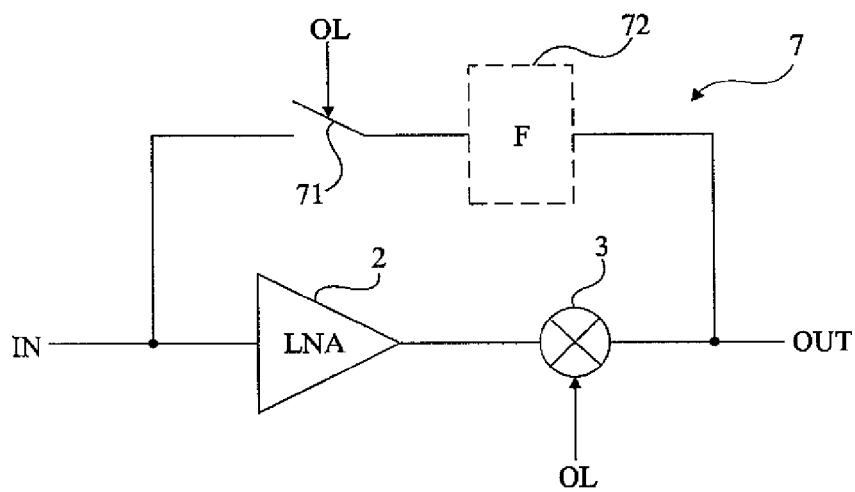
FIG. 2 is a block diagram of a partial embodiment of an RF receive chain.

FIG. 2 is a block diagram of an embodiment of a mixer-amplifier. Such a mixer-amplifier is capable of being interposed on an RF receive line, for example, between an antenna and an electronic processing circuit of the type illustrated in FIG. 1, with or without interposed filtering and matching elements.

A low-noise amplifier 2 (LNA) is series-connected with a mixing circuit 3, the output of amplifier 2 being directly connected to the input of mixer 3. Input IN of amplifier 2 receives an RF signal originating, for example, from an antenna of the type of antenna 1 of FIG. 1 (possibly with one or several interposed filters). Output OUT of mixer 3 is intended to be connected (possibly with one or several interposed filters) to a circuit (for example 4, FIG. 1) for processing the baseband signals. A reverse feedback circuit 7 samples the output of mixer 3 to feed back a portion of the signal at input IN of amplifier 2. Reverse feedback path 7 comprises a switch 71 controlled by the signal at the intermediary frequency (local oscillator OL). Optionally, a filtering element 72 is interposed in reverse feedback loop 7 in series with switch 71.

The fact of switching reverse feedback loop 7 at the frequency of the local oscillator to return to the intermediary frequency limits gain losses in this loop.

Further, optional filter 72 is a filter at the intermediary frequency and no longer at the high frequency of the RF signal. It may, for example, often have a simpler construction.

Further, one filter (5, FIG. 1) upstream of amplifier 2 may be removed provided that the application allows it.

Figure 3:
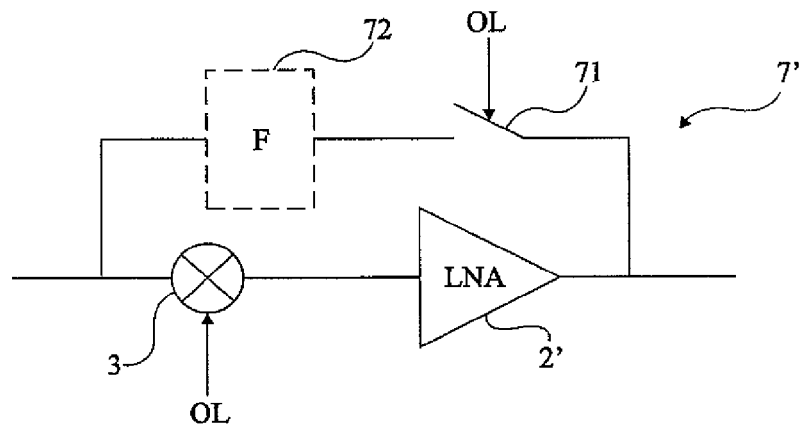
FIG. 3 is a block diagram of another embodiment of a partial RF receive chain.

FIG. 3 shows another embodiment of a mixer-amplifier in which a first variation with respect to the embodiment of FIG. 2 is an inversion of the respective positions of the amplifier and of mixer 3 in the series association. As a result, amplifier 2' is designed to operate at the intermediary frequency and not at that of the RF signal. Another modification is an inversion of the respective positions of switch 71 and of filter 72 in reverse feedback loop 7'.

Figure 4:
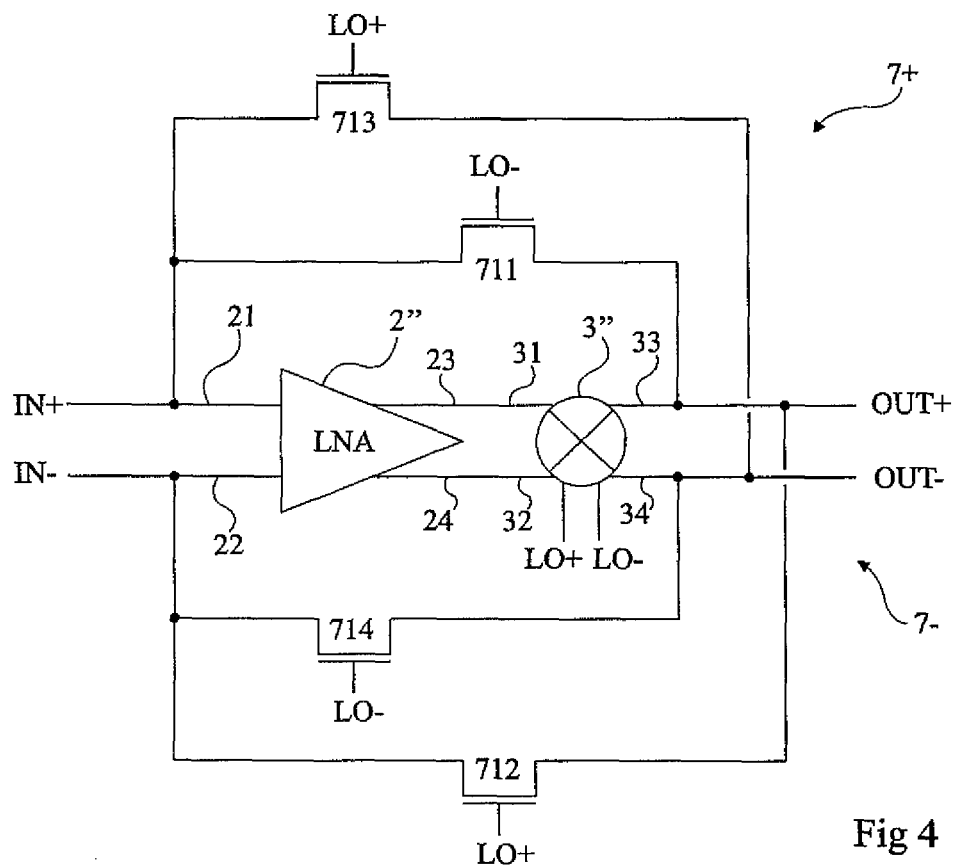
FIG. 4 is a block diagram of another embodiment applied to a differential structure.

FIG. 4 shows a further embodiment of a mixer-amplifier applied to an embodiment with a differential structure of low-noise amplifier 2" and of mixer 3". In this example, respective inputs IN+ and IN− of the mixer-amplifier are directly connected to input terminals 21 and 22 of differential amplifier 2", which respectively receive the outputs of two reverse feedback paths 7+ and 7−. Differential outputs 23 and 24 of amplifier 2" are connected to inputs 31 and 32 of mixer 3" having respective differential outputs 33 and 34 defining respective outputs OUT+ and OUT− of the mixer-amplifier towards the processing circuits of the reception device. Each reverse feedback loop 7+, 7− comprises two paths bringing respective outputs 33 and 34 of mixer 3" onto inputs IN+ and IN− of amplifier 2" via switches. For example, output 33 is connected via a MOS transistor 711 to terminal IN+ and via a MOS transistor 712 to terminal IN−. Further, output terminal 34 is connected via a MOS transistor 713 to terminal IN+ and via a MOS transistor 714 to terminal IN−. Mixer 3" further comprises two differential inputs LO+ and LO− of the signal at the intermediary frequency, which receive complementary signals. Transistors 712 and 713 are controlled by positive local oscillator signal LO+ while transistors 711 and 714 are controlled by negative local oscillation signal LO−.

Figure 5:
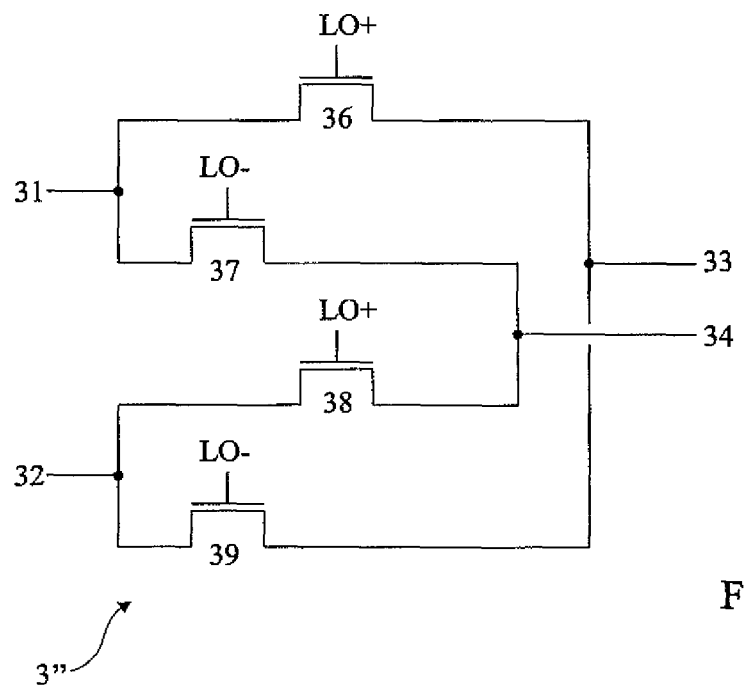
FIG. 5 illustrates an embodiment of the mixer of FIG. 4.

FIG. 5 is a simplified example of a mixer 3" formed of four transistors 36, 37, 38, and 39. Transistors 36 and 37 connect terminal 31 respectively to terminals 33 and 34 while transistors 38 and 39 connect terminal 32 respectively to terminals 34 and 33. Transistors 36 and 38 are controlled by positive signal LO+ while transistors 37 and 39 are controlled by signal LO−. The operation of the circuit of FIG. 5 is that of a usual mixer.

The described mixer-amplifier enables performing the impedance-matching of the amplifier with no external inductance. The filtering in the reverse feedback enables to further improve the linearity. The reverse feedback further enables a wide-band matching for a multiple-standard use.

Various embodiments have been described. Different variations and modifications are within the abilities of those skilled in the art. In particular, the respective constructions of the amplifier and of the mixer are within the abilities of those skilled in the art using common structures, be they differential or non-differential, provided to provide a reverse feedback on the series-association of the mixer and of the amplifier, switched at the frequency of the local oscillator of the mixer. Further, several amplifiers may be provided in the series association, for example, with the mixer being interposed between two amplifiers respectively operating at the frequency of the input signal and at the intermediary frequency. Further, the different variations may be combined. Finally, any switch type (MOS, bipolar transistors, etc.) may be used according to the technology used for the rest of the elements of the mixer-amplifier.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A mixer-amplifier comprising:
   a mixer-amplifier circuit, including an amplifier circuit followed by a mixing circuit, configured to amplify an RF signal applied to the amplifier circuit and to convert a frequency of the RF signal to a lower frequency, the mixing circuit being controlled at a local oscillator frequency; and
   a reverse feedback loop including a switch that is switched at the local oscillator frequency, the reverse feedback loop being coupled directly to an output of the mixing circuit and to an input of the amplifier circuit, wherein the mixer-amplifier circuit includes differential inputs and differential outputs and wherein the reverse feedback loop includes a first feedback path comprising a first transistor directly coupled between a + output and a + input and switched by the negative local oscillator signal, a second feedback path comprising a second transistor directly coupled between a − output and the + input and switched by the positive local oscillator signal, a third feedback path comprising a third transistor directly coupled between the + output and a − input and switched by the positive local oscillator signal, and a fourth feedback path comprising a fourth transistor directly coupled between the − output and the − input and switched by the negative local oscillator signal.

2. A mixer-amplifier as defined in claim 1, wherein the reverse feedback loop further comprises a filter at the local oscillator frequency connected in series with the switch.

3. A mixer-amplifier as defined in claim 1, wherein the mixer-amplifier circuit has differential inputs and differential outputs.

4. A mixer-amplifier as defined in claim 1, wherein the mixer-amplifier circuit has a single-ended input and a single-ended output.

5. A mixer-amplifier as defined in claim 1, wherein the mixing circuit includes a first mixer path between a + input and a + output and switched by the positive local oscillator signal, a second mixer path between the + input and a − output and switched by the negative local oscillator signal, a third mixer path between a − input and the − output and switched by the positive local oscillator signal and a fourth mixer path between the − input and the + output and switched by the negative local oscillator signal.

* * * * *